United States Patent [19]
Harada et al.

[11] Patent Number: 5,341,026
[45] Date of Patent: Aug. 23, 1994

[54] SEMICONDUCTOR DEVICE HAVING A TITANIUM AND A TITANIUM COMPOUND MULTILAYER INTERCONNECTION STRUCTURE

[75] Inventors: Shigeru Harada; Kazuhiro Ishimaru; Kimio Hagi, all of Hyogo, Japan

[73] Assignee: Mitsubishi Denki Kabushiki Kaisha, Tokyo, Japan

[21] Appl. No.: 842,019

[22] Filed: Feb. 26, 1992

[30] Foreign Application Priority Data

Apr. 9, 1991 [JP] Japan .............................. 3-076544(P)

[51] Int. Cl.$^5$ ..................... H01L 23/48; H01L 29/46; H01L 29/54; H01L 29/62
[52] U.S. Cl. .................................. 257/764; 257/750; 257/751; 257/763; 257/765; 257/758; 257/759; 257/767; 257/770; 257/774
[58] Field of Search ............... 257/763, 764, 765, 770, 257/771, 774, 758, 759, 734, 750, 751, 754, 767

[56] References Cited

U.S. PATENT DOCUMENTS

4,556,897 12/1985 Yorikane et al. ................... 257/763

FOREIGN PATENT DOCUMENTS

| 4128421A1 | 3/1992 | Fed. Rep. of Germany . |
| 61-90445 | 5/1986 | Japan . |
| 64-59937 | 3/1989 | Japan . |

OTHER PUBLICATIONS

"High Performance Multilevel Interconnection System with Stacked Interlayer Dielectrics by Plasma CVD and Bias Sputtering", Abe et al., Jun. 12–13, 1989 VMIC Conference, 1989 IEEE, pp. 404–410.

"A New Reliability Problem Associated with Ar Ion Sputter Cleaning of Interconnect Vias", Tomioka et al., 1989 IEEE/IRPS, pp. 53–58.

"Comparison of Electromigration Phenomenon Between Aluminum Interconnection of Various Multilayers Materials", Fujii et al., Jun. 12–13, 1989 VMIC Conference, 1989 IEEE, pp. 477–483.

"VLSI Electronics Microstructure Science", vol. 15, 1987, Edited by Norman G. Einspruch, pp. 304–305.

*Primary Examiner*—Sara W. Crane
*Assistant Examiner*—Carl Whitehead, Jr.
*Attorney, Agent, or Firm*—Lowe, Price, LeBlanc & Becker

[57] ABSTRACT

A semiconductor integrated circuit device has an interconnection structure in which multilayer aluminum interconnection layers are connected through connection holes. A first aluminum interconnection layer is formed on a main surface of the semiconductor substrate. The first aluminum interconnection layer has a surface layer which includes any of high melting point metal, high melting point metal compound, high melting point metal silicide, or amorphous silicon. An insulating layer is formed on the first aluminum interconnection layer, and has a through hole if formed extending to a surface of the first aluminum interconnection layer. A second aluminum interconnection layer is formed on the insulating layer and is electrically connected to the surface layer of the first aluminum interconnection layer through the through hole. The second aluminum interconnection layer includes a titanium layer, a titanium nitride layer and an aluminum alloy layer. The titanium layer is formed on the insulating layer to be in contact with the surface of the first aluminum interconnection layer through the through hole. The titanium nitride layer is formed on the titanium layer. The aluminum alloy layer is formed on the titanium nitride layer. An electrical contact resistance between the first and second aluminum interconnection layers is stabilized, and resistance against the electromigration and stress-migration is improved in the interconnection structure.

9 Claims, 14 Drawing Sheets

SEMICONDUCTOR DEVICE HAVING A TITANIUM AND A TITANIUM COMPOUND MULTILAYER INTERCONNECTION STRUCTURE

BACKGROUND OF THE INVENTION

1. Field of the Invention

The present invention relates generally to interconnection structures of semiconductor integrated circuit devices and a manufacturing method therefor and, more particularly to an interconnection structure of a semiconductor integrated circuit device in which multilayer aluminum interconnection layers are mutually connected through a connection hole, and to a manufacturing method therefor.

2. Description of the Background Art

In general, a semiconductor device comprises a semiconductor substrate and elements such as transistors formed thereon. Various interconnection layers are formed on the semiconductor substrate for electrically connecting these elements to each other and to an external circuit(s). These interconnection layers have been formed of polysilicon films, high melting point metal films, high melting point metal silicide films, aluminum films and aluminum alloy films. In recent years, reduction of the interconnection layer resistance has been required in the semiconductor integrated circuit devices which are highly integrated for high speed operation. Therefore, the semiconductor integrated circuit devices essentially require aluminum multilayer interconnection structure formed of aluminum films or aluminum alloy films having a small resistivity.

FIG. 14 is a partial sectional view showing an example of an aluminum multilayer interconnection structure in the conventional semiconductor integrated circuit device. In the figure, a silicon semiconductor substrate 1 bears DRAM (Dynamic Random Access Memory) cells 2 which are formed in a stacked cell structure. A base insulator film 3 is formed on the DRAM cells 2. The first aluminum interconnection layers 4 are formed on the base insulator film 3 with predetermined spaces between each other. The first aluminum interconnection layers 4 are covered with an interlayer insulating film 5, which is provided with connection holes 6 (also called as "via-holes" or "through-holes"). Second aluminum interconnection layers 7 are formed on the interlayer insulating film 5 and are connected to the first aluminum interconnection layers 4 through the connection holes 6. A protection insulator film 8 is formed to cover the DRAM cell 2, first aluminum interconnection layers 4 and second aluminum interconnection layers 7 to protect them against moisture and other external material from entering.

In the conventional aluminum multilayer interconnection structure shown in FIG. 14, yield and reliability of the semiconductor device technically depend on stability of a connection part (hereinafter called "via-hole part") between the first aluminum interconnection layer and the second aluminum interconnection layer. A manufacturing method of the conventional aluminum multilayer interconnection structure shown in FIG. 14 will be described particularly with respect to formation of the via-hole part. The multilayer interconnection structure has been generally formed of a combination of polysilicon wirings, high melting point metal wirings, high melting point silicide interconnection layers and aluminum wirings. However, the following discussion is made with respect to an aluminum two-layer structure in which both interconnection layers in the first and second layers are aluminum interconnection layers.

FIGS. 15–21 are partial sectional views showing, in accordance with manufacturing steps, a manufacturing method for the aluminum two-layer interconnection structure in the conventional semiconductor integrated circuit device.

Referring to FIG. 15, the DRAM cell 2 is formed on a surface of the silicon semiconductor substrate 1. The DRAM cell 2 is formed of an element separator oxide film 301, a transfer gate electrode 302, an impurity diffusion layer 303, a word line 304, a storage node 305, a capacitor insulator film 306, a cell plate 307 and an insulator film 309.

Referring to FIG. 16, the base insulator film 3 is formed on an entire surface of the silicon semiconductor substrate 1, on which the DRAM cell 2 has been formed. Then, photolithography and etching technique are used for forming a contact hole 308 at a predetermined position in the base insulator film. The first aluminum interconnection layer 4 is formed as a bit line and electrically contacts with the impurity diffusion layer 303 through this contact hole 308.

Recently, a semiconductor integrated circuit device in which sizes of elements are reduced to an order of submicron has employed the interconnection layer in which a barrier metal film 310, e.g., of titanium nitride (TiN) or titanium-tungsten (TiW) and an aluminum alloy film 311 of Al-Si-Cu or others are combined. The aluminum interconnection layer having such structure has been used for the following reasons.

(1) If the aluminum is in direct contact with the silicon substrate (impurity diffusion layer) at the contact part, an abnormal reaction (i.e., alloy spike) is locally caused. This produces a reaction layer which breaks through a region of the impurity diffusion layer and extends downwardly in the silicon substrate, resulting in a junction leak at the impurity diffusion layer. In order to prevent this, the barrier metal film is formed in direct contact with the silicon substrate (impurity diffusion layer).

(2) Silicon in the aluminum alloy film is deposited at the contact part due to the solid-phase epitaxial growth, which causes imperfect contact. In order to prevent this, the barrier metal film is formed under the aluminum alloy film.

(3) Upper layers such as an interlayer insulating film and protection insulator film are formed over the aluminum interconnection layer. A film stress by these upper insulator films may break the aluminum interconnection layers. In order to increase the resistance against such stress migration phenomenon, the barrier metal film is formed under the aluminum alloy film.

A film forming the first aluminum interconnection layer 4 is usually formed by deposition in a sputter method and subsequent patterning thereof, using the photolithography and etching.

Structures in which the first aluminum interconnection layer is foraged of a stacked layer structure of a titanium film, a titanium nitride film and an aluminum contained film are disclosed in the Japanese Patent Laying-Open Nos. 64-59937 (1989) and 61-90445 (1986).

Referring to FIG. 17, the interlayer insulating film 5 is formed on the whole surface of the first aluminum interconnection layer 4. This interlayer insulating film 5 is formed of a combination of a silicon oxide film 321 formed by, e.g., the CVD (Chemical Vapor Deposition), an inorganic application insulator film 322 and a silicon oxide film 323 formed by the CVD.

The silicon oxide film 321 is formed by the CVD utilizing a heat and a plasma at a formation temperature of 300°–450° C., using a mixture of on one hand a silane (SiH$_4$) gas and on the other hand an oxygen (O$_2$) gas or a dinitrogen monoxide (N$_2$O) gas. Recently, a silicon oxide film has been formed from an organic silane contained material such as TEOS (Tetra-Ethyl-Ortho-Silicate) characterized by a good step coverage.

The inorganic application insulator film 322 formed for flattening generally includes silanol (Si(OH)$_4$) or the like as a main component. After application of material including the silanol or the like as a main component by spin coating, baking is carried out at a temperature of 400°–450° C. for changing it to a silicon oxide film, whereby the surface of the silicon oxide film 321 formed by the CVD is flattened. Since this inorganic application insulator film 322 has a high hygroscopic property, it may cause a disadvantage such as gas emission if the insulator film 322 is exposed at a side wall of the via-hole part. Therefore, an etchback processing using dry etching by a fluorine contained gas or argon gas is effected on this inorganic application insulator film 322 so as to prevent the exposure of the surface of the inorganic application insulator film 322 at the side wall of the via-hole part.

A silicon oxide film 323 is formed on the inorganic application insulator film 322 in a manner similar to that for forming the silicon oxide film 321.

Referring to FIG. 18, the connection hole 6 is formed by the photolithography and etching to expose a predetermined surface area of the first aluminum interconnection layer 4. This step is carried out as follows.

A photoresist 324 is provided to cover an area except for that in which the connection hole 6 is formed by the photolithography. Then, the interlayer insulating film 5 is selectively removed by a taper etching method to open the connection hole 6. The taper etching method is a combination of wet etching by a fluorine contained solution and reactive ion etching using a mixture of gases of CHF$_3$ and O$_2$ as main components.

The photoresist 324 as well as a reaction product and others produced in the etching are removed by an oxygen (O$_2$) plasma and a wet chemical processing after the etching.

Referring to FIG. 19, in the step for forming the connection hole 6, the surface of the first aluminum interconnection layer 4 is exposed to a plasma of a fluorine contained gas such as CHF$_3$ and/or an oxygen gas so that a deterioration layer 201 of aluminum which includes fluoride and oxide is formed at a thickness of about 100 Å on the surface of the first aluminum interconnection layer 4 in the connection hole 6. Therefore, in order to remove an insulator film, i.e., the thin deterioration layer of the aluminum and to obtain a stable contact resistance, sputter etching using an argon ion (Ar$^+$) 202 is effected prior to the formation of the second aluminum interconnection layer.

Then, as shown in FIG. 20, the second aluminum interconnection layer 7 is continuously deposited in a vacuum, using the sputter method. This second aluminum interconnection layer 7 is a film of aluminum alloy such as Al-Si, Al-Si-Cu or Al-Cu. This film is formed by the patterning, using the photolithography and etching in a manner similar to that for the first aluminum interconnection layer.

After the formation of the second aluminum interconnection layer 7, heat treatment is carried out at a temperature of about 400°–450° C. so as to electrically contact the first and second aluminum interconnection layers 4 and 7 together in the connection hole 6.

Finally, as shown in FIG. 21, the protection insulator film 8 such as a silicon oxide film or silicon nitride film is deposited on the second aluminum interconnection layer 7 by the CVD so as to protect the semiconductor elements and interconnection layers against the moisture and other entering from the external.

The aluminum multilayer interconnection structure of the prior art has the following problems.

Due to the miniaturization of the wiring, the diameter of the connection hole 6 has been reduced. If the diameter of the connection hole 6 is at a sub-micron level, a problem may be caused with respect to stability and reliability in the electrical connection at the contact hole 6.

In the prior art, as described above, the sputter etching is effected by the argon ion prior to the formation of the second aluminum interconnection layer 7. In this etching, as shown in FIG. 22, an argon ion 202 removes a deterioration layer 201 (a layer including the fluoride and oxide of the aluminum) formed on the surface of the first aluminum interconnection layer 4 in the connection hole 6. In the conventional structure in which the contact hole 6 has a relatively small aspect ratio (B/A) less than 1 (one), wherein A is a diameter of the connection hole and B is a film thickness (about 1 μm) of the interlayer insulating film, particles 203 of the oxide and the fluoride of aluminum sputtered by the argon ion 202 sufficiently scatter up to the outside of the connection hole 6, as shown in FIG. 22. Therefore, the deterioration layer 201 of the aluminum is removed and thus the surface of the first aluminum interconnection layer 4 in the connection hole 6 can be cleaned.

However, if the connection hole 6 having the diameter at the sub-micron level and the aspect ratio (B/A) over one, as shogun in FIG. 23, the particles 203 of the oxide and fluoride of aluminum sputtered by the argon ion 202 is partially blocked by the side wall of the connection hole 6, and thus can not scatter to the outside of the connection hole 6. Therefore, some of the particles 204 re-stick onto the inside of the connection hole 6.

As a result, even if the continuous deposition of the second aluminum interconnection layer 7 in a vacuum is carried out as a next step, the particles 204 of the oxide and fluoride of aluminum, which have stuck onto an interface 205 between the first and second aluminum interconnection layers 4 and 7 in the connection hole 6 during the sputter etching, remain there, as shown in FIG. 24. Thereby, in the heat treatment at about 400°–450° C. after the formation of the second aluminum interconnection layer, mixing can not be sufficiently effected at the interface 205 between the first and second aluminum interconnection layers.

Consequently, a contact resistance (called a "via-hole resistance") in the connection hole 6 may be increased and/or an open failure, i.e., a failure in conduction between the first and second aluminum interconnection layers, may be caused.

Further, even if the initial via-hole resistance has a correct value owing to a heat treatment at 400°–450° C. described above, the mixing has not been sufficiently effected at the interface 205 between the first and second aluminum interconnection layers. Therefore, the reliability in the connection hole 6 such as resistance against the electro-migration and stress-migration is reduced.

These problems are and will be significant in the semiconductor integrated circuit devices which are miniaturized in the half micron order and the semiconductor integrated circuit devices which, in the future, will be miniaturized in the sub-micron order and thus will have a further increased aspect ratio (B/A).

Aspect ratio (B/A), considerations also apply to contact holes for lower wiring layers other than the aluminum and the silicon semiconductor substrate, e.g., to the contact hole 308 shown in FIG. 16. However, a natural oxide film, deterioration layer and/or others which are formed on the surface of the contact hole 308 can be selectively removed by the cleaning processing with adequate acid or alkali such as hydrofluoric acid.

However, in the via-hole part described above, the lower wiring layer is formed of the aluminum interconnection layer having less resistance against solution of the acid and alkali. Therefore, it is impossible to employ the above described cleaning processing with the strong acid or alkaline for removing the deterioration layer and others.

In order to solve the problems mentioned above caused by the re-sticked particles during the sputter etching, it is known to form a surface layer 312 including a high melting point metal film (ex. tungsten layer and titanium tungsten), a high melting point metal compound film (ex. titanium cintride film), a high melting point metal silicide film (ex. molybdenum silicide film and tungsten silicide), an amorphous silicon film, and so on. This structure can decrease the amount of the sputter etching, since it makes thin deterioration layer 313 formed during the process of making the connection hole. Thereby, the quantity of the re-sticked particles during the sputter etching can be reduced, and the problems mentioned above can be reduced. However, such problems can not be completely solved since the sticked particles are still generated.

SUMMARY OF THE INVENTION

Accordingly, it is an object of the invention to promote the mixing at an interface in a connection part between a lower aluminum interconnection layer and an upper aluminum interconnection layer.

Another object of the invention is to stabilize a via-hole resistance at the connection part between the upper and lower aluminum interconnection layers.

Still another object of the invention is to improve reliability of resistance against electro-migration and stress-migration at the via-hole part.

Yet another object of the invention is to provide an interconnection structure of a semiconductor integrated circuit device of which quality and yield are improved.

Still object of the invention is to manufacture an interconnection structure which promotes the mixing at the interface in a connection part between a lower aluminum interconnection layer and an upper aluminum interconnection layer.

Another object of the invention is to manufacture an interconnection structure in which a via-hole resistance at the connection part between the upper and lower aluminum interconnection layers is stabilized.

Still another object of the invention is to manufacture an interconnection structure in which reliability of resistance against electro-migration and stress-migration at the via-hole part is improved.

Yet another object of the invention is to manufacture an interconnection structure of a semiconductor integrated circuit device of which quality and yield are improved.

An interconnection structure for a semiconductor integrated circuit device according to the invention includes a first aluminum interconnection layer, an insulating layer and a second aluminum interconnection layer. The first aluminum interconnection layer is formed on the main surface of the semiconductor substrate. The surface layer including at least one of a high melting point metal, a high melting point metal compound, a high melting metal silicide or an amorphous silicon is formed on the first aluminum interconnection layer. The insulating layer is formed on the first aluminum interconnection layer and has a through hole extending from a surface of the insulating layer to the first aluminum interconnection layer. The second aluminum interconnection layer is formed on the insulating layer, and is electrically connected to the first aluminum interconnection layer through the through hole. The second aluminum interconnection layer includes a titanium layer, a titanium compound layer and an aluminum contained layer. The titanium layer is formed on the insulating layer and extending through the through hole. The titanium compound layer is formed on the titanium layer. The aluminum contained layer is formed on the titanium compound layer.

In the interconnection structure of the present invention, the upper second aluminum interconnection layer contacting with a surface layer formed on the lower first aluminum interconnection layer at an area in the through hole has a base film which employs a stacked layer structure formed of the titanium layer and the titanium compound layer. The surface layer includes at least one of the high melting point metal, the high melting point metal compound, the high melting point metal silicide, and the amorphous silicon. The surface of the surface layer is in contact with the titanium layer. This titanium layer has a strong binding power with fluorine and oxygen. Therefore, even if particles of oxide and fluoride of high melting point metals remain on the surface of the surface layer at the area in the connection hole due to sticking during the sputter etching, it provides the following effects.

(1) The titanium layer captures the particles of the oxide and fluoride of high melting point metals as the oxide and fluoride of titanium, and decomposes them.

(2) The titanium layer reacts with the surface layer to improve tight contact between the titanium layer and the surface layer.

Meanwhile, the titanium compound layer formed on the titanium layer prevents reaction of the titanium layer in contact with the surface layer with the upper aluminum contained layer, and serves to expedite reaction of the titanium layer with the surface layer.

That is, if the titanium compound layer were not formed, a layer for preventing the reaction of the titanium layer and the upper aluminum contained layer would not exist at the interface therebetween, and thus the titanium layer would easily react with the upper aluminum contained layer at a relatively low temperature of about 200°–300° C. to form the intermetallic compound (TiAl$_3$) prior to the reaction with the surface layer. In this case, the titanium layer will not sufficiently decompose the oxide and fluoride of the high melting point metals on the surface of the surface layer. Further-more, the titanium layer cannot sufficiently react with the surface layer, and thus unable to improve tight contact.

The structure of the invention, however, includes the provision of the titanium compound layer, which has less reactivity with the aluminum, on the titanium layer to suppress the reaction of the titanium layer and the upper aluminum contained layer. Therefore, by the heat treatment at 300°–450° C. after the formation of the upper aluminum contained layer, the oxide and fluoride of the high melting point metals remaining on the surface of the surface layer in the connection hole, which are produced by re-sticking in the sputter etching, are captured as the oxide and fluoride of titanium and are decomposed. Further, the titanium layer and the surface layer react with each other to cause tight contact at the interface between the titanium layer and the surface layer.

In this manner, the electric contact resistance (via-hole resistance) is stabilized even at the connection hole having a diameter at the sub-micron level. Further, the reliability such as the resistance against the electron-migration and stress-migration at the via-hole part is improved.

According to the method of manufacturing interconnection structure for the semiconductor integrated circuit device, a first aluminum interconnection layer is formed on the main surface of the semiconductor substrate. A surface layer including at least one of high melting point metal, high melting point metal compound, high melting point metal silicide or the amorphous silicon is formed on the first aluminum interconnection layer. An insulator layer is formed on the surface layer. A through hole exposing at least the surface of the surface layer is formed by selectively removing the insulator layer. A titanium layer is formed on the insulator layer to make it in contact with the surface of the surface layer through the through hole. A titanium compound layer is formed on the titanium layer. An aluminum contained layer is formed on the titanium compound layer.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
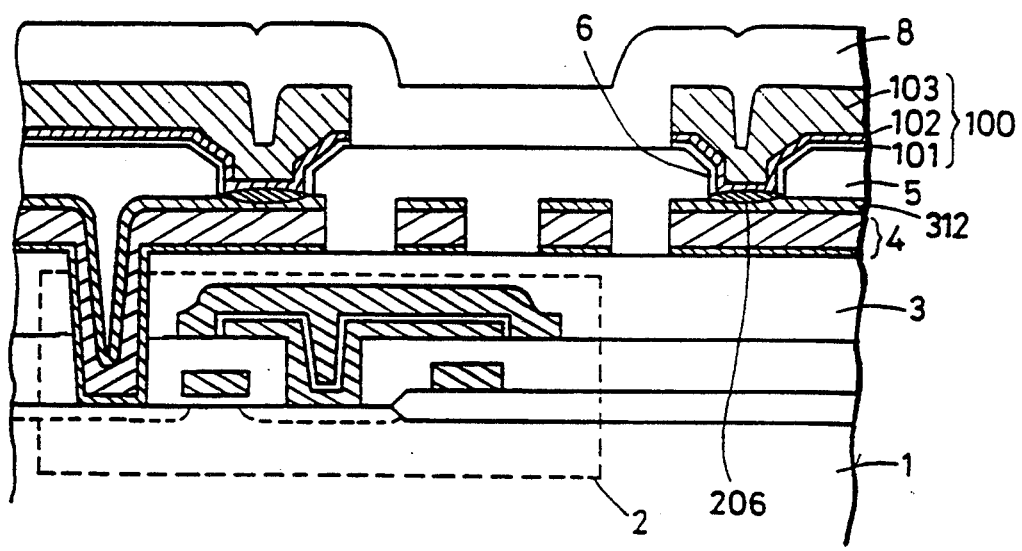
FIG. 1 is a partial sectional view showing an interconnection structure of a semiconductor integrated circuit device in accordance with the first embodiment of the present invention.

Referring to FIG. 1, a silicon semiconductor substrate 1 bears a DRAM cell 2 formed thereon. A base insulator film 3 is formed on this DRAM cell 2. First aluminum interconnection layers 4 which are spaced from each other are formed on the base insulator film 3. A tungsten layer 312 is formed on first aluminum interconnection layer 4. An interlayer insulating film 5 is formed to cover tungsten layer 312 and is provided with connection holes 6 extending to surfaces of tungsten layer 312. Second aluminum interconnection layers 100 are formed on the interlayer insulating film 5 in such a manner that the layers 100 electrically connect to the first aluminum inter connection layer 4 through the above connection holes 6. The second aluminum interconnection layers 100 are formed of titanium films 101, titanium nitride films 102 and aluminum or aluminum alloy films 103, respectively. Each titanium film 101 is formed as a base film of the second aluminum interconnection layer 100 and is in contact with the surface of the tungsten layer 312. The titanium nitride film 102 is formed as a base film of the second aluminum interconnection layer 100 and is located on the titanium film 101. The aluminum or aluminum alloy film 103 is formed on the titanium nitride film 102. An interconnection structure thus formed is protected from an ambient circumstance by a protection insulator film 8 formed entirely thereon. An intermetallic compound (TiW) layer 206 is formed at an interface between the titanium film 101 and the tungsten film 312 by the reaction between them.

The embodiment of the interconnection structure shown in FIG. 1 will be further discussed particularly with respect to a forming method of a connection part (via-hole part) of the lower first aluminum interconnection layer 4 and the upper second aluminum interconnection layer 100.

Forming steps providing the structure of FIG. 2 of the prior art which have been described with reference to FIGS. 15–18 are the same as those in the present invention except that tungsten layer 312 is formed thereon by the sputter method after the formation of aluminum alloy film 311, and thus those steps in the invention will not be described below.

Figure 2:
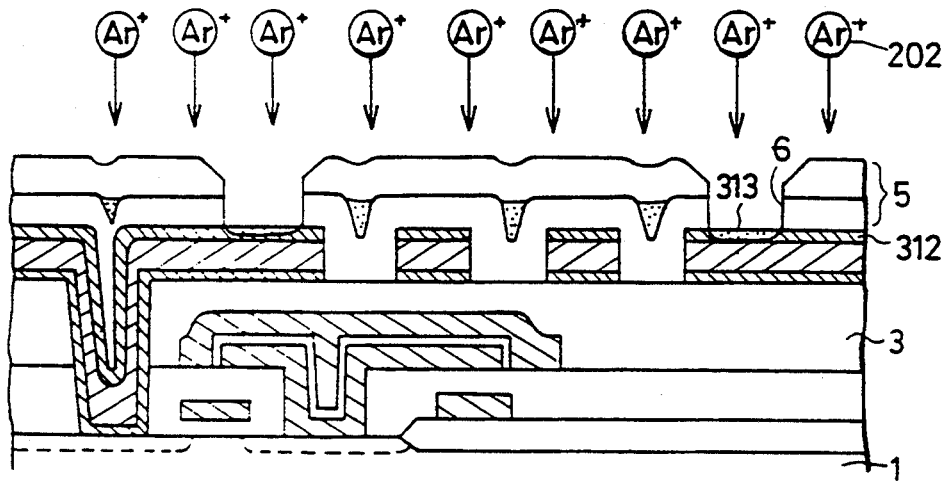
FIGS. 2 to 8 are cross sectional views showing, in order steps of manufacturing an interconnection structure shown in FIG. 1.

Referring to FIG. 2, the surface of the tungsten film 312 in the connection hole 6 was exposed to the plasma of an oxygen gas or a fluorine contained gas such as $CHF_3$ during the forming step of the connection hole 6, so that a deterioration layer 313 (a layer including fluoride and/or oxide of tungsten) has been formed at a thickness of about 50–100 Å on the surface of the tungsten. In order to remove this thin deterioration layer 313 for obtaining a stable via-hole resistance, sputter etching is effected by an argon ion 202.

Figure 3:
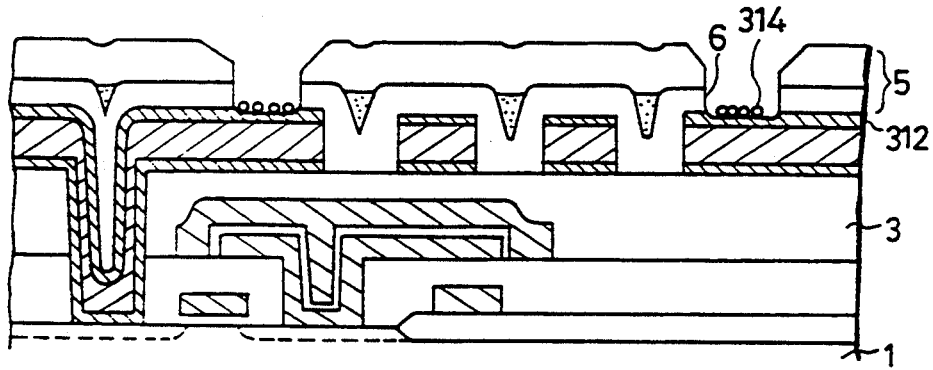

Referring to FIG. 3, if the connection hole 6 has an aspect ratio (B/A) over one, and thus is at a sub-micron level, the sputter etching by the argon ion 202 causes sticking of the oxide and/or fluoride particles of tungsten which are sputtered by the argon ion as described above. Thus, there are residual particles 314 of the oxide and fluoride of tungsten on a surface of the tungsten layer 312 in the connection hole 6.

Figure 4:
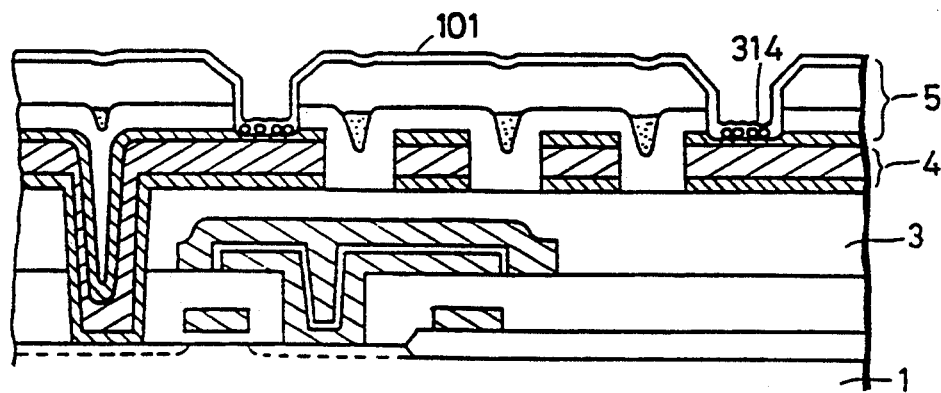

As shown in FIG. 4, after the majority of the deterioration layer 313 of the tungsten is removed by the sputter etching, the titanium film 101 is continuously deposited on the entire surface in the vacuum by the sputter method to have a thickness of about 50–150 Å so as to decompose the slight residual particles 314 of the deteriorated substance of tungsten.

Figure 5:
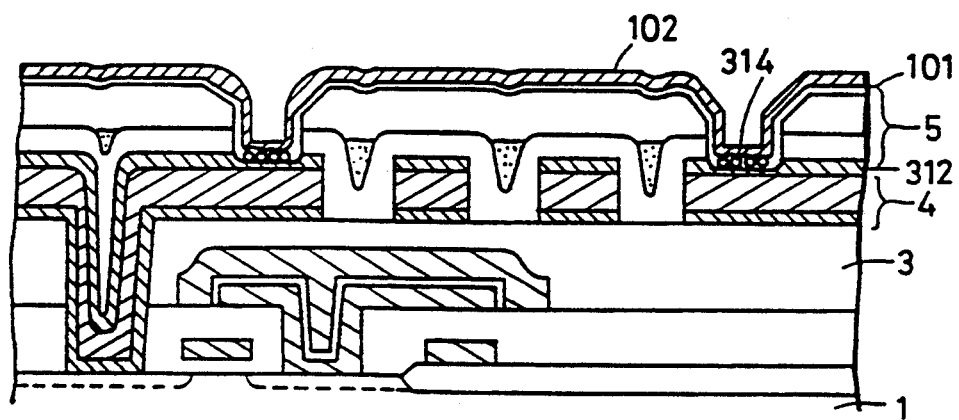

Then, referring to FIG. 5, the titanium nitride film 102 is deposited at a thickness of about 500–1000 Å on the titanium film 101. As a method for this depositing, a reactive sputter method is usually used, in which the sputtering is effected in an ambient gas of $Ar+N_2$, using a Ti target. This titanium nitride film 102 serves to suppress the reaction of the titanium film 101, which is in contact with the tungsten film 312, with the upper aluminum contained film in the via-hole part. For this purpose, the titanium nitride film thus used has a small specific resistance of about 250–400 $\mu\Omega$·cm so as to reduce reactivity with the upper aluminum contained film and to sufficiently suppress the increase of the via-hole resistance.

If the titanium nitride film were to be used as a barrier metal film at the contact part with the silicon substrate, that is, to serve as a barrier against the silicon and aluminum, a film having a high specific resistance of about 400–2000 $\mu\Omega$·cm would be required. Such use of the titanium nitride film in the via-hole part would cause that the via-hole resistance to be several times as large as that of the conventional structure. However, in the present invention the titanium nitride film 102 used in the via-hole part is formed, as described above, for suppressing the reaction of the titanium film 101 and the upper aluminum contained film. Therefore, this titanium nitride 102 is not required to serve as a barrier against the alumine. This enables the use of the titanium nitride film having a low specific resistance of about 250–400 $\mu\Omega$·cm. As a result, the increase of the via-hole resistance is less than 50% and thus in a level which practically causes no problem.

The thickness of the titanium nitride film 102 is determined at a value of about 500–1000 Å for suppressing the reaction of the lower titanium film 101 with the upper aluminum contained film and for suppressing the increase of the via-hole resistance at the level which causes no practical problem.

Figure 6:
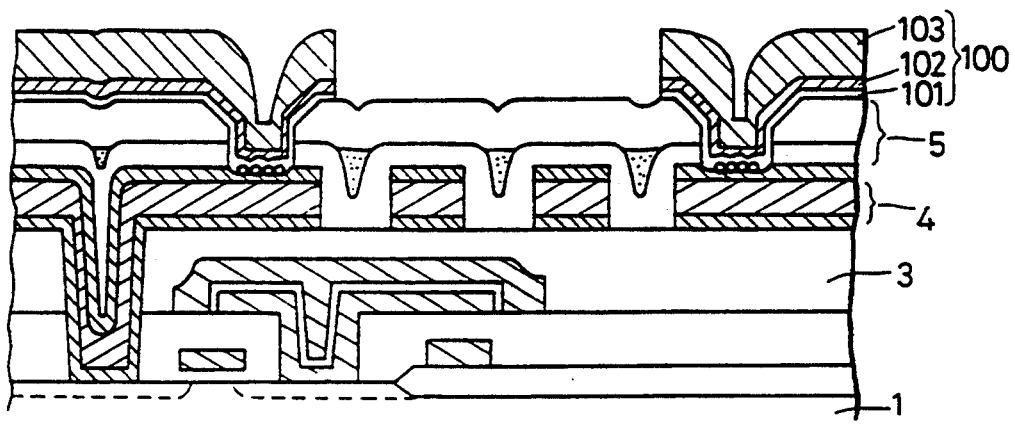

After the above step, as shown in FIG. 6, an uppermost layer of the second aluminum interconnection layer 100 is formed by an aluminum alloy film 103 such as Al-Si-Cu film which is continuously deposited by the sputter method. Then, the aluminum interconnection layer 100 of a three-layer structure formed of the titanium film 101, titanium nitride film 102 and aluminum alloy film 103 is patterned in a manner similar to that for the first aluminum interconnection layer 4, using the photolithography and etching.

Figure 7:
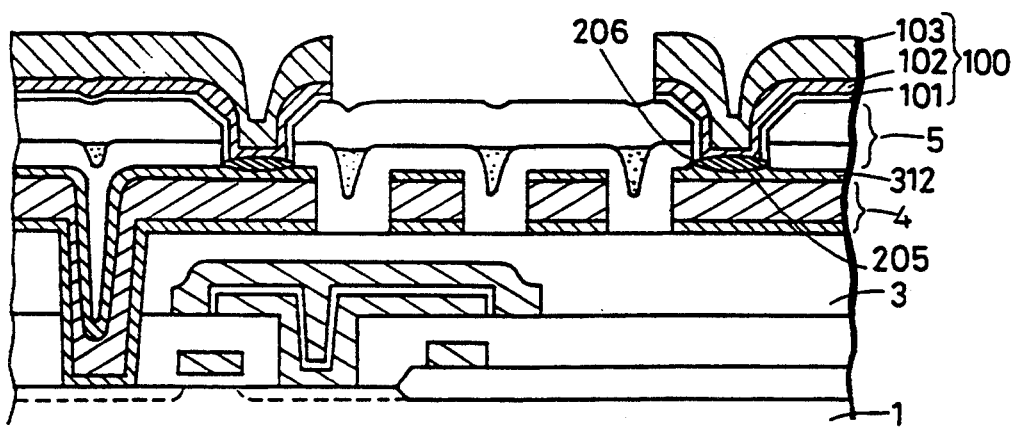

Referring to FIG. 7, heat treatment is effected for about 15–60 minutes at a temperature of 300°–450° C. so as to promote mixing at the interface between the first and second aluminum interconnection layers 4 and 100. Thereby, the titanium film 101 functions to decompose the residual particles 314 of the oxide and fluoride of tungsten on the surface of the tungsten film 312 in the via-hole part. Further, tungsten film 312 reacts with the titanium film 101 to form the intermetallic compound 206.

Figure 9:
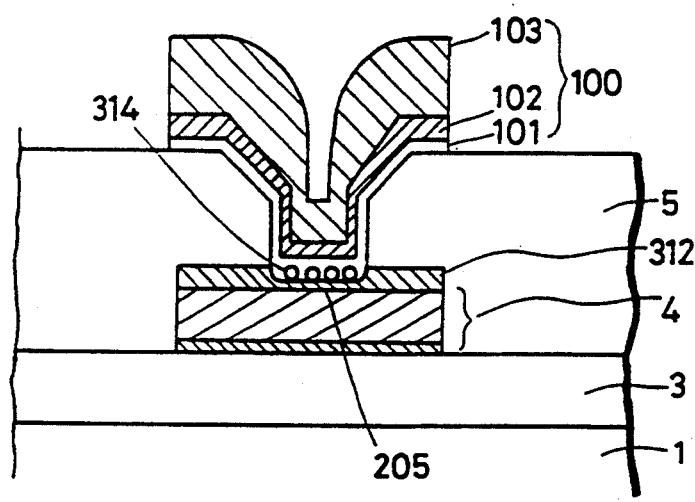
FIGS. 9 and 10 are enlarged partial sectional views showing the connection structures of a first aluminum interconnection layer and a second aluminum interconnection layer for illustrating a function at an interface thereof.
Figure 10:
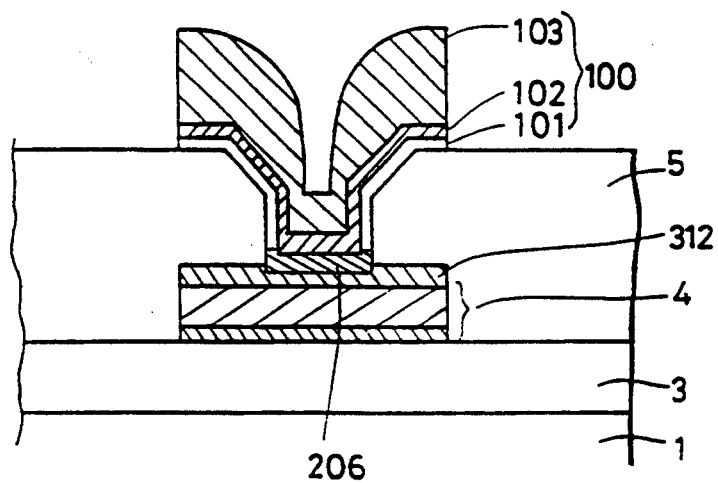

FIGS. 9 and 10 show in enlarged forms a connection structure of the first and second aluminum interconnection layers 4 and 100 for illustrating a mixing operation at the interface between them. Referring to FIG. 9, due to the sticking of the particles of the oxide and fluoride of tungsten in the sputter etching, the particles 314 of the deteriorated substance of tungsten remain on the surface of the tungsten film 312 even after the formation of the second aluminum interconnection layer 100. These particles 314 will impede the mixing operation at the interface 205 between the first and second aluminum interconnection layers 4 and 100.

Therefore, as shown in FIG. 10, after the formation of the second aluminum interconnection layer 100, the heat treatment is effected for 15–60 minutes at the temperature of 300°–450° C., as described before. Thereby, the particles 314 of the deteriorated substance of tungsten are captured as the fluoride and oxide of titanium and are decomposed. This can be achieved owing to a fact that the titanium film 101 has a strong binding force with the fluorine and oxygen, which constitute the deteriorated substance of tungsten, and easily forms the oxide and fluoride of titanium by the heat treatment at 300°–450° C. Further, this heat treatment causes reaction of the tungsten film 312 and the titanium film 101 to form the intermetallic compound layer 206. Thereby, the mixing operation at the interface 205 is promoted.

Figure 8:
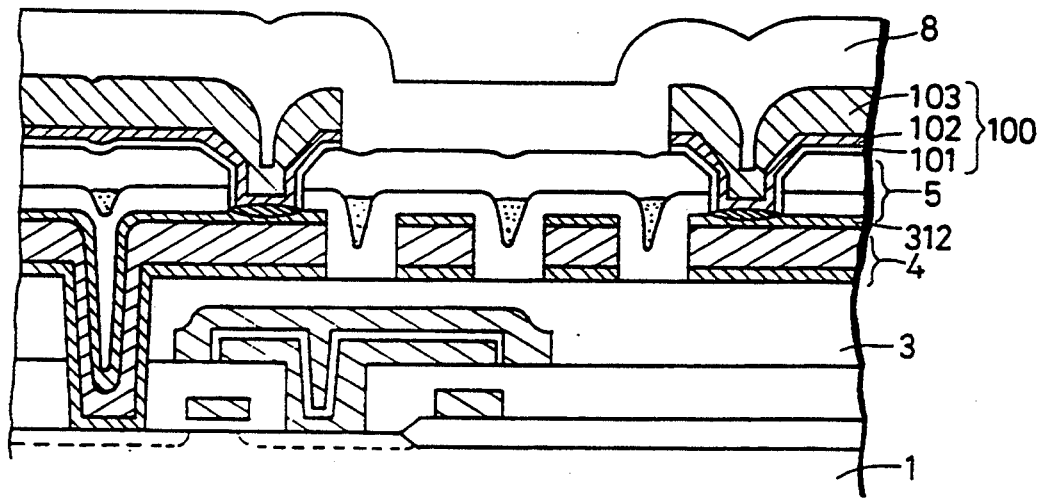

Finally, with reference to FIG. 8, the protection insulator film 8 such as a silicon oxide film or silicon nitride film is deposited on the second aluminum interconnection layers 100 by the CVD in order to protect the semiconductor elements and interconnection layers formed on the semiconductor substrate against external moisture and others.

The thickness of the titanium film 101 employed in the interconnection structure of the invention has an optimum value for reasons which will be described below with reference to FIGS. 11 and 12.

Figure 11:
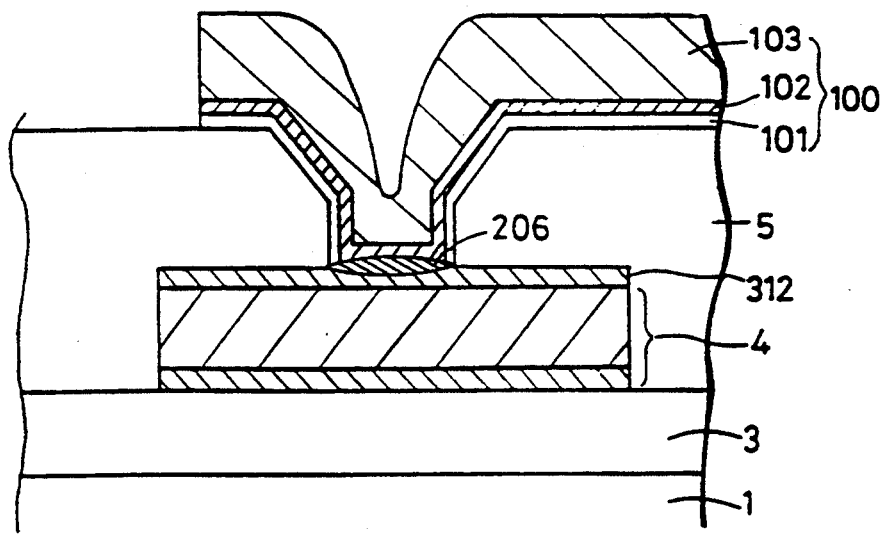
FIGS. 11 and 12 are the enlarged partially sectional views showing the interconnection structures for illustrating existence of an optimum value of a titanium film thickness in an interconnection structure of the present invention.
Figure 12:
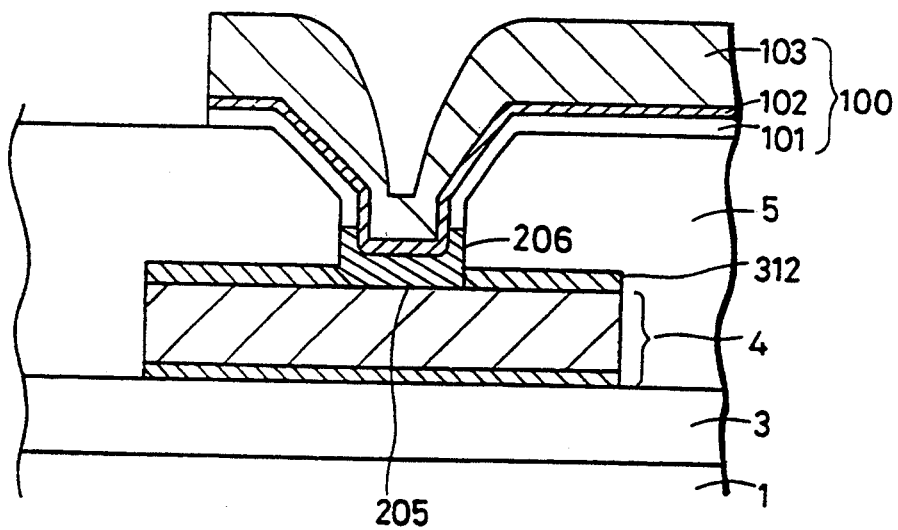

FIG. 11 shows the interconnection structure of the titanium film 101 having a thickness of an optimum value. If the thickness of the titanium film 101 is excessively large, the intermetallic compound layer 206 is formed in excess, resulting in the state shown in FIG. 12. Generation of the intermetallic compound layer 206 reduces the volute of the contact part in the first aluminum interconnection layer 4 and the second aluminum interconnection layer 100, resulting in the stress generated at the surface 205. If quantity of the generated intermetallic compound layer 206 is large, the reduction in volume will increase resulting in the generation of a large stress at the surface 205. This is the main reason why the surface 205 between the first aluminum interconnection layer 4 and the second aluminum interconnection layer 100 is weak, and why the mechanical strength is reduced.

If the thickness of the titanium film 101 is excessively small, it is impossible to sufficiently achieve the decomposition of the particles of the fluoride and oxide of tungsten and promotion of the mixing operation at the surface 205.

For the above reasons, the thickness of the titanium film 101 employed in the interconnection structure in the invention has upper and lower limits. The inventors have found by experiment that the desired thickness of the titanium film 101 is in a range from 50 Å to 150 Å.

The above embodiment has been discussed with respect to such a case that the titanium nitride film 102 is disposed on the titanium film 101 for suppressing the reaction of the titanium film 101 and the aluminum alloy film 103 which form the second aluminum interconnection layer. However, same or similar effect can be achieved even by other titanium compound films such as titanium oxide film and titanium nitrogen oxide film which similarly serve to suppress the mutual reaction of them. These films can be deposited by the reactive sputter method similarly to the above embodiment. Thus, in the ambient gas of $A_r + O_2$ for the deposition of the titanium oxide film, or in the ambient gas of $A_r + O_2 + N_2$ for the deposition of the titanium nitrogen oxide, the sputtering is effected, using the Ti as the target, whereby the desired titanium compound film can be deposited.

The embodiment described above shows the formation of the tungsten film 312 on the surface of the first aluminum interconnection layer 4. However, the same effects can also be achieved when the film formed on the surface may be other high melting point metal films such as the titanium—tungsten (Ti - W) film, high melting point metal compound film such as nitride titanium (TiN) film, high melting point metal silicide film such as molybdenum silicide (MoSi2) or tungsten silicide (WSi2) film, and amorphous film.

Although the embodiment discussed above has the two-layer interconnection structure of aluminum, similar effects can also be achieved when the present invention is applied to the semiconductor integrated circuit device having the aluminum multilayer interconnection structure including three or more layers.

Although the above embodiment has been discussed with respect to a semiconductor integrated circuit device including the DRAM cells formed on the surface of the semiconductor substrate, similar effects can be achieved even when applied to a semiconductor integrated circuit device including other elements.

Figure 13:
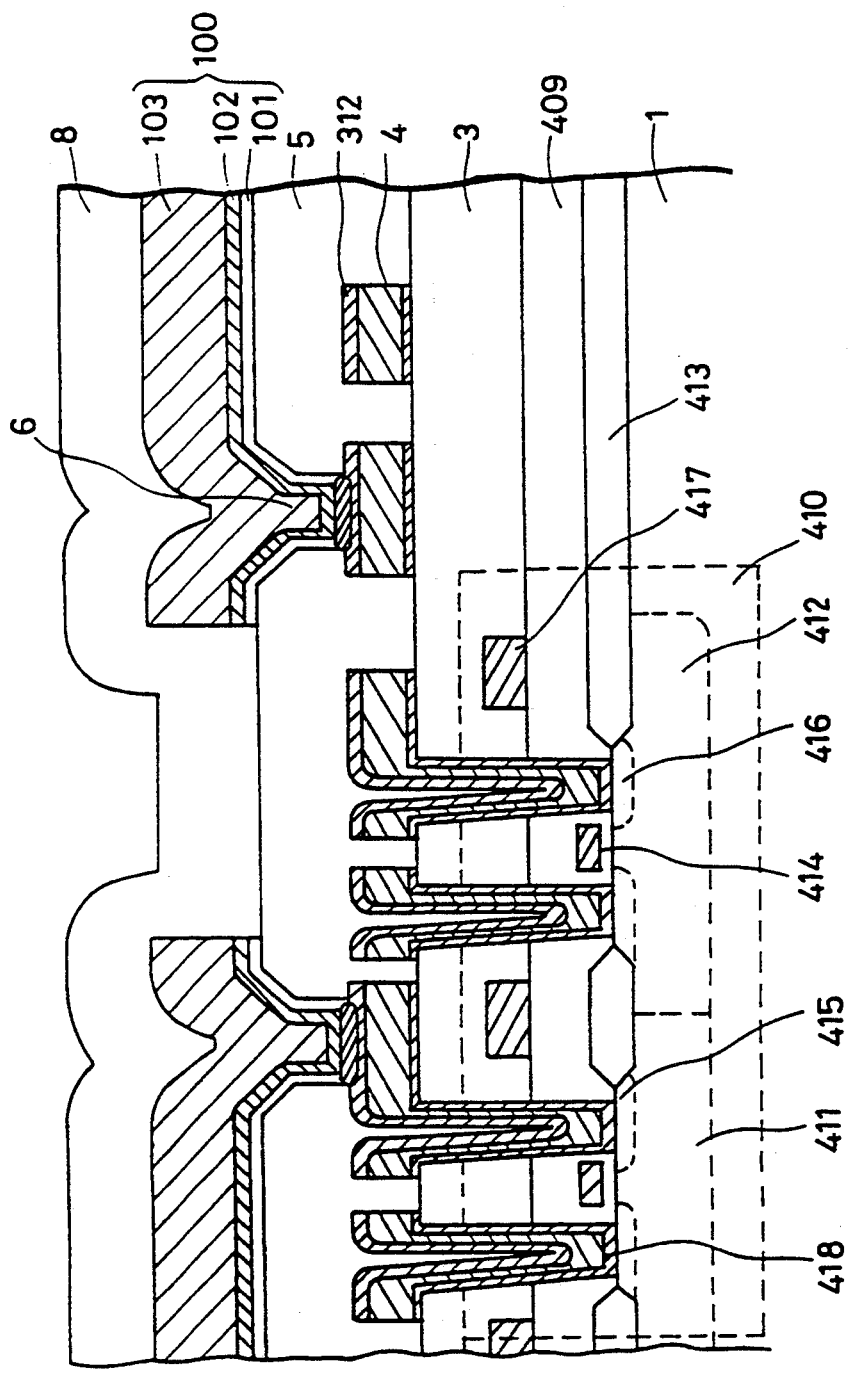
FIG. 13 is a partial sectional view showing an interconnection structure of a semiconductor integrated circuit device of another embodiment of the present invention.
Figure 14:
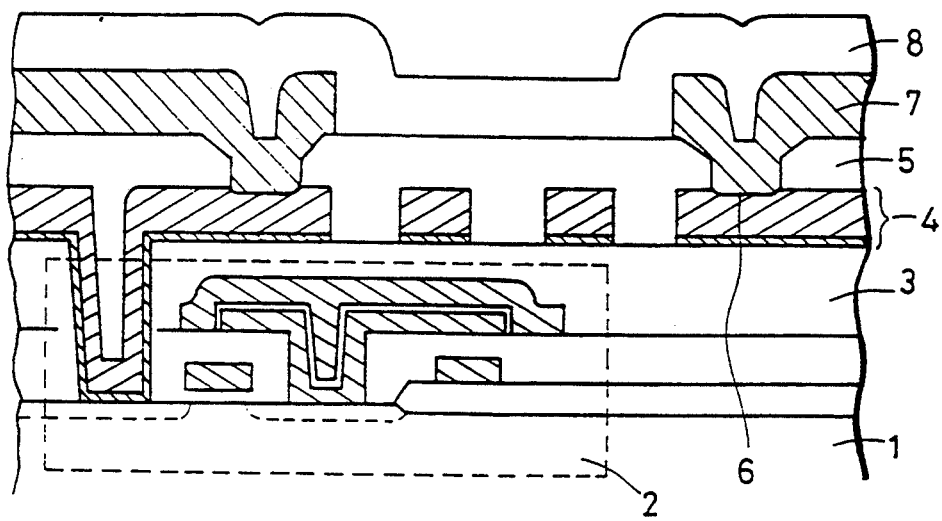
FIGS. 14 to 21 are partial sectional views showing, in order steps of manufacturing an interconnection structure of the prior art shown in FIG. 13.
Figure 15:
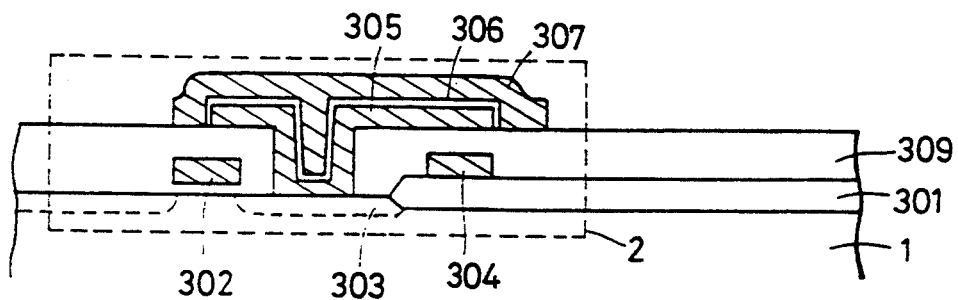
Figure 16:
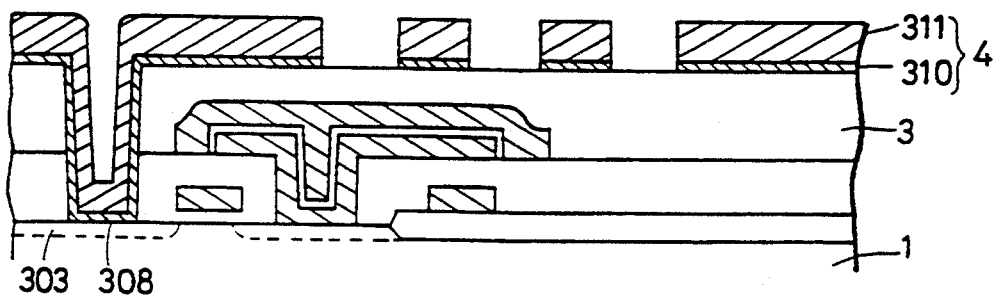
Figure 17:
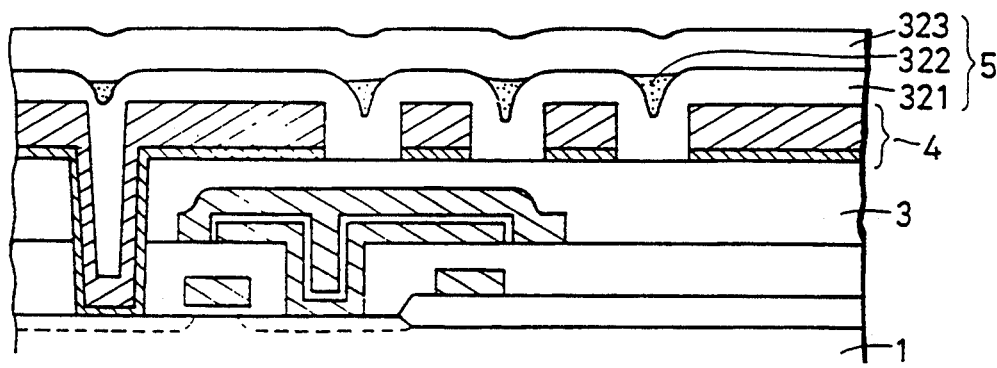
Figure 18:
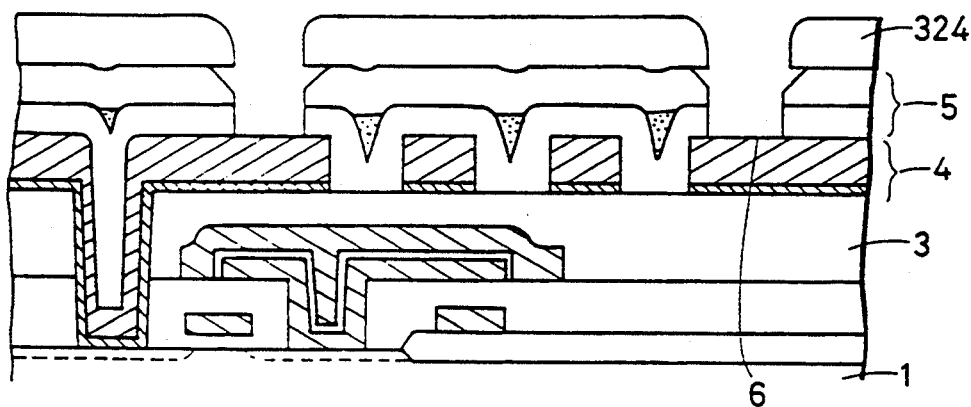
Figure 19:
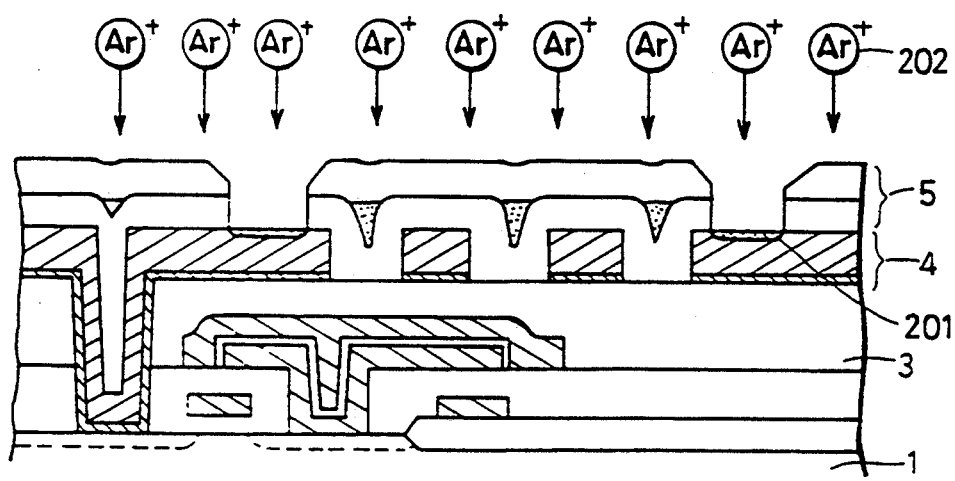
Figure 20:
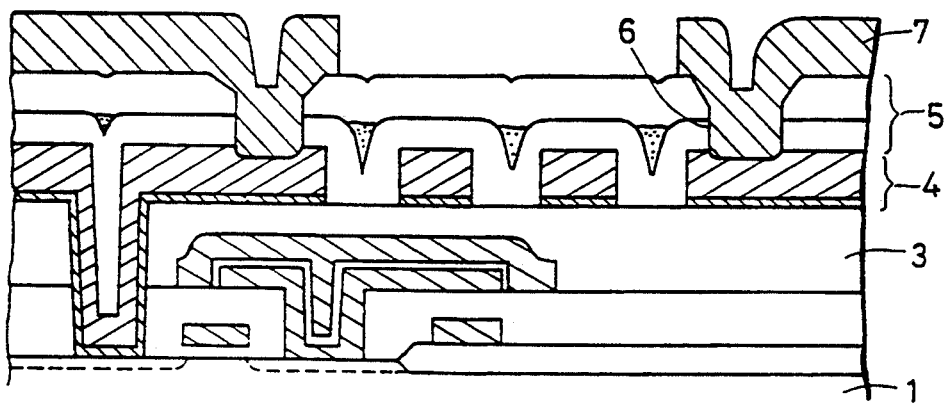
Figure 21:
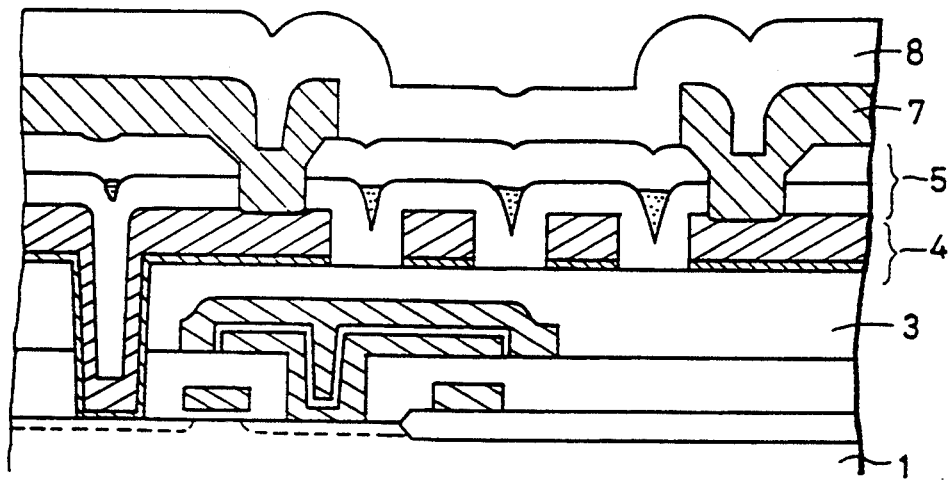
Figure 22:
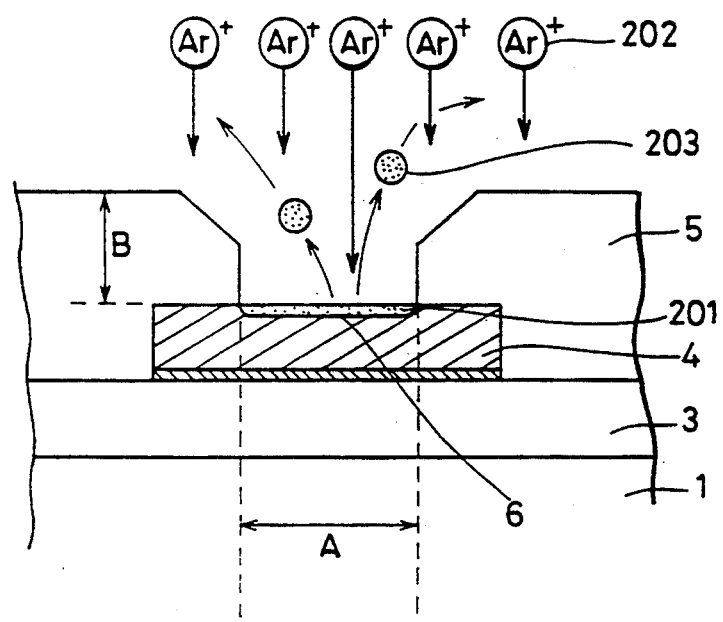
FIGS. 22 and 23 are partial sectional views for illustrating sputter etching in a formation step of a conventional interconnection structure.
Figure 23:
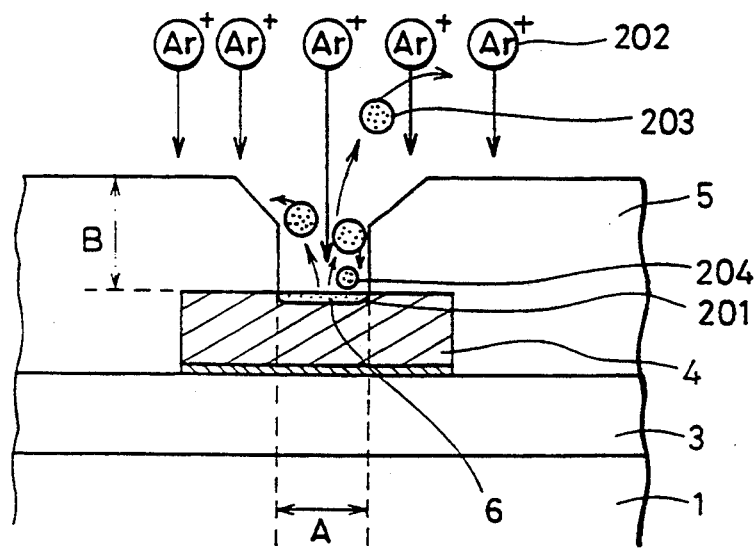
Figure 24:
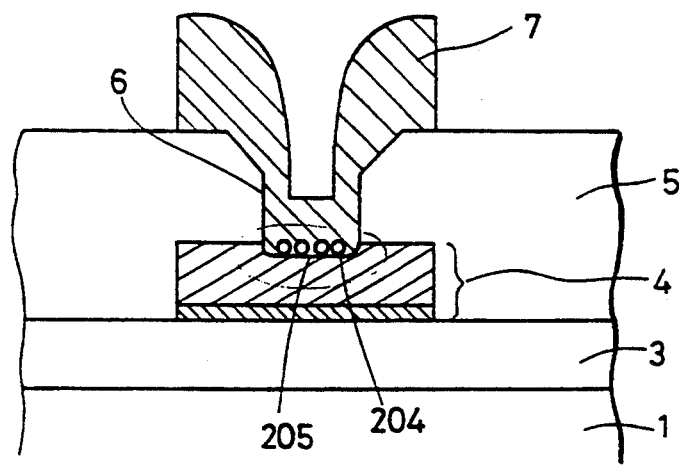
FIG. 24 is an enlarged partial sectional view showing a conventional interconnection structure.
Figure 25:
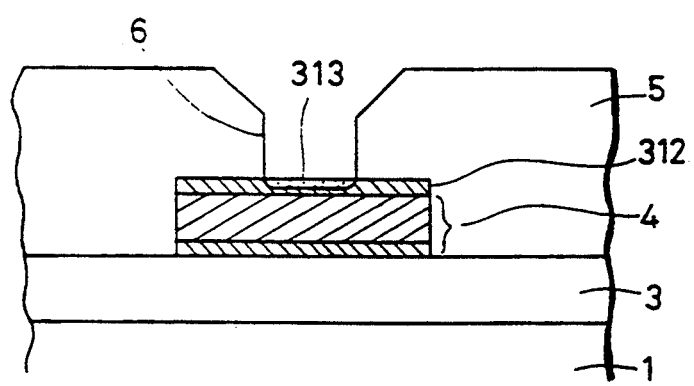
FIG. 25 is a partial sectional view showing the state of a deterioration layer when tungsten film is formed on the surface of a first aluminum interconnection layer.

For instance, FIG. 13 shows another embodiment in which the aluminum multilayer interconnection structure according to the present invention is applied to a semiconductor integrated circuit device provided with SRAM (Static Random Access Memory) cells formed on the surface of the semiconductor substrate. The structure of the semiconductor integrated circuit device having the SRAM cells will not be discussed in detail, and only a principal structure will be discussed below.

Referring to FIG. 13, there is formed on the surface of the silicon semiconductor substrate 1 a SRAM cell 410 having a double well CMOS (Complementary Metal Oxide Semiconductor) structure. The silicon semiconductor substrate 1 is provided with p-type well regions 411 and n-type well regions 412 adjacent thereto. These well regions 411 and 412 are electrically separated from each other by element separator oxide films 413 which are spaced from each other and are formed on the silicon semiconductor substrate 1. The p-type well regions 411 are provided with n-type diffusion layers 415 which are spaced from each other, and a gate electrode 414 is formed therebetween. The p-type well regions 412 are provided with n- type diffusion layers 416 which are spaced from each other, and a gate electrode 414 is also formed therebetween. The gate electrodes 414 are covered with an insulator film 409. Polysilicon interconnection layers 417 which are spaced from each other are formed on the insulator film 409. A base insulator film 3 is deposited on the SRAM cell 410. These base insulator film 3 and the insulator film 409 are provided with contact holes 418 respectively extending to the surfaces of the n-type impurity diffusion layers 415 or p-type impurity diffusion layer 416. The first aluminum interconnection layers 4 are formed on the base insulator film 3 and are in contact with the impurity diffusion layers 415 or 416 through the contact holes 418. The connection structure of the first and second interconnection layers 4 and 100 are same as that shown in FIG. 1.

Similarly, elements formed on the surface of the silicon semiconductor substrate 1 may be elements having structures other than those of the DRAM cell and SRAM cell, in other words, they may be EPROM (Erasable Programmable Read Only Memory) cells, EEPROM (Electrical Erasable Programmable ROM) cells, microcomputer circuit elements, CMOS logic circuit elements, bipolar transistor elements and others.

According to the present invention, as described above, the stacked layer structure formed of the titanium layer and the titanium compound layer is used as the base film of the upper aluminum interconnection layer which is in contact with the lower aluminum interconnection layer through the connection hole, whereby the stable contact can be obtained at the area in the connection hole of the multilayer aluminum interconnection structure. Therefore, the electrical contact resistance is stabilized, and the reliability of the semiconductor integrated circuit device such as resistance against the electron-migration and stress-migration in the connection hole is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection structure for a semiconductor integrated circuit device, comprising:
   a semiconductor substrate having a main surface;
   a first interconnection layer comprising an aluminum layer formed on a barrier film layer, the barrier film layer contacting a portion of the main surface;
   a surface layer comprising one of a high melting point metal, a high melting point metal compound, a high melting point metal silicide, or an amorphous silicon, formed on said aluminum layer;
   an insulating layer formed on a surface of said surface layer, having a through hole extended to the surface of said surface layer; and
   a second interconnection layer comprising aluminum formed on said insulating layer and electrically connected to said surface layer through said through hole,
   wherein said second interconnection layer includes
   a titanium layer portion formed on said insulating layer and in contact with the surface of said surface layer to form a contact interface defined by said through hole;
   a titanium compound layer portion formed on said titanium layer portion; and
   an aluminum-containing layer portion formed on said titanium compound layer portion.

2. An interconnection structure for a semiconductor integrated circuit device according to claim 1, wherein said titanium layer has a thickness in a range from 50 to 150 Å.

3. An interconnection structure for a semiconductor integrated circuit device according to claim 1, wherein said titanium compound layer comprises titanium nitride.

4. An interconnection structure for a semiconductor integrated circuit device according to claim 3, wherein said titanium nitride layer has a specific resistance in a range of 250–400 $\mu\Omega\cdot cm$.

5. An interconnection structure for a semiconductor integrated circuit device according to claim 4, wherein said titanium nitride layer has a thickness in a range of 500–1000 Å.

6. An interconnection structure for a semiconductor integrated circuit device according to claim 1, wherein said interconnection structure further comprises an intermetallic compound layer formed from titanium of said titanium layer portion and said one of said high melting point metal, said high melting point metal compound, said high melting point metal silicide, and said amorphous silicon between said titanium compound layer portion and said surface layer.

7. An interconnection structure for a semiconductor integrated circuit device according to claim 6, wherein said first aluminum interconnection layer contains silicon.

8. An interconnection structure for a semiconductor integrated circuit device according to claim 2, wherein said interconnection structure further comprises an intermetallic compound layer formed of titanium and said one of said high melting point metal, said high melting point metal compound, said high melting point metal silicide, and said amorphous silicon between said titanium compound layer portion and said first interconnection layer, wherein said first interconnection layer comprises silicon.

9. An interconnection structure for a semiconductor integrated circuit device according to claim 1, wherein a ratio of a depth to a diameter of said through hole is not smaller than 1.

* * * * *